(12) United States Patent
Endo

(10) Patent No.: US 11,187,725 B2
(45) Date of Patent: Nov. 30, 2021

(54) SHUNT RESISTOR AND CURRENT SENSING DEVICE USING SHUNT RESISTOR

(71) Applicant: KOA CORPORATION, Ina (JP)

(72) Inventor: Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 232 days.

(21) Appl. No.: 16/485,925

(22) PCT Filed: Jan. 31, 2018

(86) PCT No.: PCT/JP2018/003069
§ 371 (c)(1),
(2) Date: Aug. 14, 2019

(87) PCT Pub. No.: WO2018/150870
PCT Pub. Date: Aug. 23, 2018

(65) Prior Publication Data
US 2020/0025802 A1 Jan. 23, 2020

(30) Foreign Application Priority Data
Feb. 15, 2017 (JP) .............................. JP2017-026361

(51) Int. Cl.
*H01C 1/14* (2006.01)
*H01C 7/00* (2006.01)
*G01R 1/20* (2006.01)

(52) U.S. Cl.
CPC .............. *G01R 1/203* (2013.01); *H01C 1/14* (2013.01); *H01C 7/00* (2013.01)

(58) Field of Classification Search
CPC .............. G01R 1/203; H01C 1/14; H01C 7/00
See application file for complete search history.

(56) References Cited

U.S. PATENT DOCUMENTS

| | | | | |
|---|---|---|---|---|
| 2,708,701 A | * | 5/1955 | Viola | G01R 1/203 338/49 |
| 8,730,003 B2 | * | 5/2014 | Smith | H01C 1/144 338/332 |
| 9,378,873 B2 | * | 6/2016 | Yoshioka | H01C 17/281 |
| 9,625,494 B2 | * | 4/2017 | Nakamura | H01C 3/02 |
| 10,614,933 B2 | * | 4/2020 | Endo | H01C 13/00 |

(Continued)

FOREIGN PATENT DOCUMENTS

| CN | 202102037 U | 1/2012 |
|---|---|---|
| CN | 202149914 U | 2/2012 |
| CN | 106093523 A | 11/2016 |

(Continued)

OTHER PUBLICATIONS

U.S. Appl. No. 16/302,773, filed May 8, 2017, Tamotsu Endo.
Office Action in China Application No. 201880010422.3, dated Feb. 7, 2021, 8 pages.

*Primary Examiner* — Kyung S Lee
(74) *Attorney, Agent, or Firm* — Crowell & Moring LLP

(57) ABSTRACT

A shunt resistor including first and second terminals made of an electrically conductive metal material, and a resistive element disposed between the first terminal and the second terminal. Each of the first terminal and the second terminal has a through-hole formed therein. At least one of the first terminal and the second terminal has a protruding portion protruding on a side thereof opposite to a portion bonded to the resistive element.

4 Claims, 17 Drawing Sheets

(56) References Cited

U.S. PATENT DOCUMENTS

2012/0229247 A1* 9/2012 Yoshioka .............. G01R 1/203
338/49
2014/0097933 A1   4/2014 Yoshioka et al.

FOREIGN PATENT DOCUMENTS

| JP | 54-023577 A | 2/1979 |
| JP | H05-013002 U | 2/1993 |
| JP | 11-508996 A | 8/1999 |
| JP | 2008-047571 A | 2/2008 |
| JP | 2012-109474 A | 6/2012 |
| JP | 2017-212297 A | 11/2017 |
| PL | 157615 B1 | 6/1992 |
| WO | WO 1997-002494 A1 | 1/1997 |
| WO | WO 2013/005824 A1 | 1/2013 |

\* cited by examiner

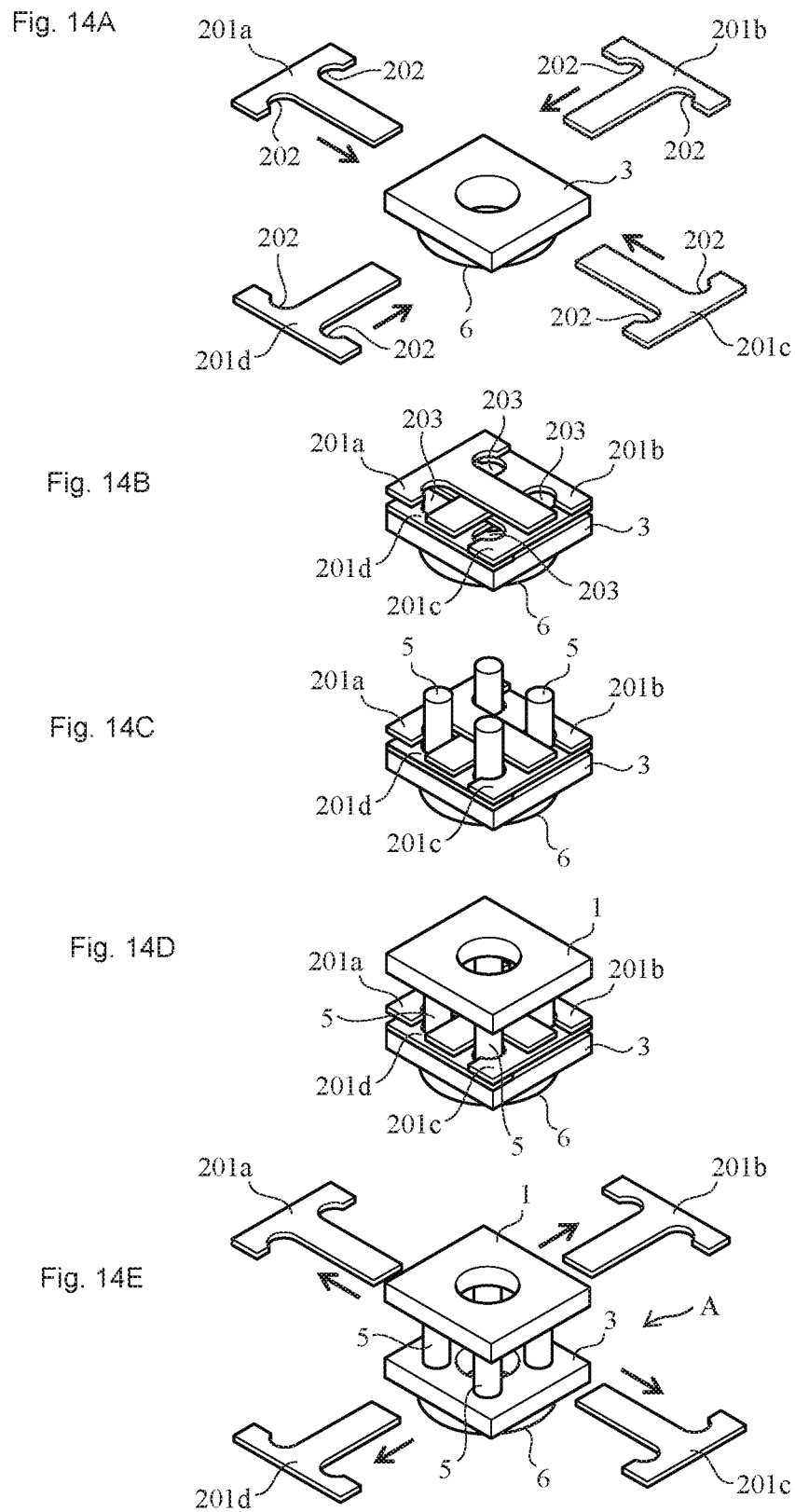

SHUNT RESISTOR AND CURRENT SENSING DEVICE USING SHUNT RESISTOR

RELATED APPLICATIONS

This application is a 371 application of PCT/JP2018/003069 having an international filing date of Jan. 31, 2018, which claims priority to JP2017-026361 filed on Feb. 15, 2017, the entire content of each of which is incorporated herein by reference.

TECHNICAL FIELD

The present invention relates to a shunt resistor and a current sensing device using a shunt resistor.

BACKGROUND ART

For example, a shunt resistor is used to sense a current in a semiconductor power module or the like mounted on an electric vehicle.

Prior literature relating to the shunt resistor used for such purpose includes the following.

Patent Literature 1 indicated below discloses a structure in which a bolt-shaped electrode portion of a shunt resistor is passed through a hole in a bus bar (current terminal) and threadably fastened.

Patent Literature 2 indicated below discloses a structure in which a washer-shaped shunt resistor is put on a battery terminal and fastened thereon.

CITATION LIST

Patent Literature

Patent Literature 1: Patent Literature 2012 109474 A
Patent Literature 2: Patent Literature 2008-047571 A

SUMMARY OF INVENTION

Technical Problem

The shunt resistor described in Patent Literature 1 has the problem that the processing of the electrode portion and the attaching operation are cumbersome.

The shunt resistor described in Patent Literature 2 has the problem that it is difficult to control the resistance value of a resistive element.

There is also no disclosure of a concrete technique for mounting the shunt resistor on a substrate.

An object of the present invention is to provide a shunt resistor which can be mounted on a substrate through a simple attaching operation and without requiring an excessive attaching space, and with which it is possible to perform high-accuracy current sensing, and a current sensing device using a shunt resistor.

Solution to Problem

According to an aspect of the present invention, there is provided a shunt resistor including first and second terminals made of an electrically conductive metal material; and a resistive element disposed between the first and second terminals. Each of the first and second terminals has a through-hole formed therein. At least one of the first and second terminals has a protruding portion protruding on a side thereof opposite to a portion bonded with the resistive element.

Preferably, a plurality of the resistive elements may be provided, the resistive elements connecting the first and second terminals in parallel.

Preferably, the resistive elements may be disposed around the through-holes.

The present invention also provides a current sensing device including first and second wiring members constituting a current pathway; a housing having the second wiring member; a wiring substrate; and a shunt resistor short-circuiting the first wiring member and the second wiring member, the shunt resistor having first and second terminals made of an electrically conductive metal material and a resistive element disposed between the first and second terminals, the first and second terminals respectively having a first through-hole and a second through-hole formed therein. The first terminal is connected to the first wiring member. The second terminal and the second wiring member are connected through a third through-hole formed in the wiring substrate. The shunt resistor and the second wiring member are fastened to each other by a fastening member passed through the first through-hole and the second through-hole.

Preferably, the second terminal may have a protruding portion formed thereon, the protruding portion being accommodated in the third through-hole.

Preferably, the second terminal may press on the wiring substrate around the third through-hole.

The present description includes the contents disclosed in JP Patent Application No. 2017-026361 to which the present application claims priority.

Advantageous Effects of Invention

According to the present invention, it is possible, with respect to a shunt resistor and a current sensing device using a shunt resistor, to simplify an operation for attaching to a substrate. It also becomes possible to perform highly accurate current sensing without requiring an excessive attaching space.

BRIEF DESCRIPTION OF DRAWINGS

FIG. 1C is a view from below.

FIGS. 14A-14E illustrate a modification, according to a sixth embodiment of the present invention, of the method of assembling the shunt resistor described in the first embodiment.

DESCRIPTION OF EMBODIMENTS

In the following, a shunt resistor and a mounting structure for a current sensing device using a shunt resistor according to embodiments of the present invention will be described with reference to the drawings.

First Embodiment

First, a first embodiment of the present invention will be described.

Figure 1A:
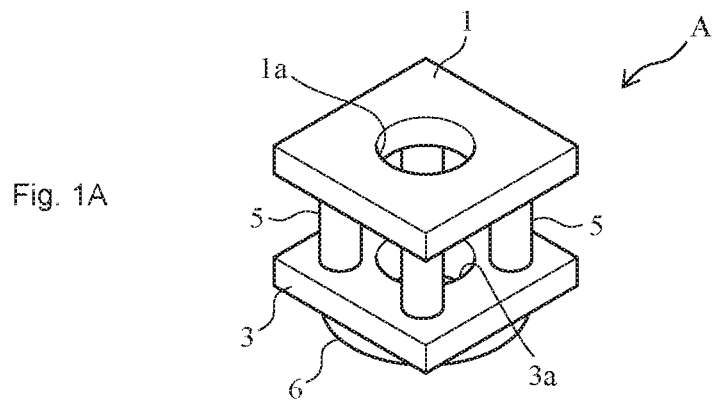
FIGS. 1A-1C depict perspective views of a configuration example of a shunt resistor according to a first embodiment of the present invention, FIG. 1A depicting a view from above, FIG. 1B depicting an exploded perspective view.
Figure 1B:
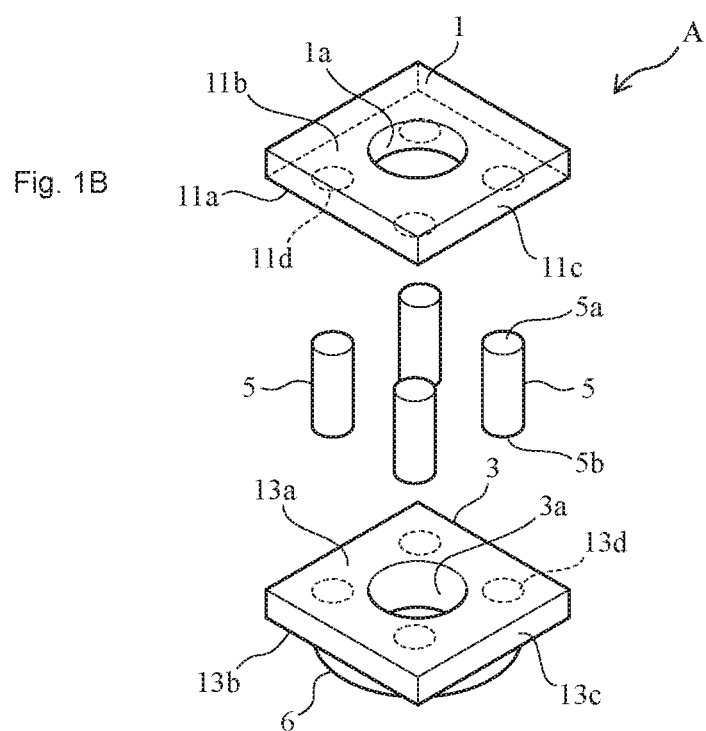
Figure 1C:
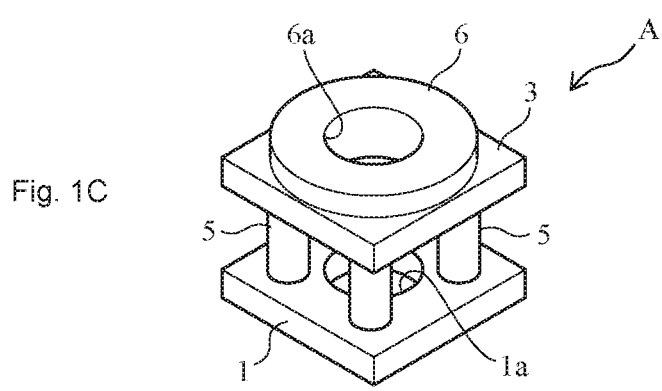

FIGS. 1A-1C depict perspective views illustrating a configuration example of a shunt resistor according to the present embodiment. FIG. 1A is a view from above. FIG. 1B is an exploded perspective view. FIG. 1C is a view from below.

The shunt resistor A according to the present embodiment includes a first terminal (electrode) 1 which is made from an electrically conductive metal material, such as Cu, and has a first plane 11a, a second plane 11b on the back surface side thereof, and an outer peripheral surface (side surface) 11c at the circumference thereof; and a second terminal (electrode) 3 which is made from an electrically conductive metal material, such as Cu, and has a first plane 13a, a second plane 13b, and an outer peripheral surface (side surface) 13c at the circumference thereof.

The first terminal 1 and the second terminal 3 have hole portions (through-holes) 1a, 3a penetrating therethrough from the first planes 11a, 13a to the second planes 11b, 13b. Numeral 1a designates a first through-hole, and numeral 3a designates a second through-hole. The hole portions (through-holes) 1a, 3a are formed on substantially the same axis so as to allow a screw, which will be described later, to penetrate through both hole portions.

The first planes 11a, 13a respectively of the first terminal 1 and the second terminal 3 are opposed to each other. On the respective first planes 11a, 13a, a plurality of resistive elements 5 are disposed, connecting the first terminal 1 and the second terminal 3 in parallel. As the material of the resistive elements 5, it is possible to use metal materials, such as a Cu—Ni based material, a Cu—Mn based material, or an Ni—Cr based material. An upper surface 5a and a lower surface 5b of the resistive elements 5 are respectively connected to the first planes 11a, 13a.

A sum of bonding areas between the upper surface 5a and the lower surface 5b of the resistive elements 5 and the respective first planes 11a, 13a is smaller than the area of the first planes 11a, 13a. That is, as depicted in FIG. 1A and FIG. 1C, the plurality of resistive elements 5 are firmly attached, by welding for example, in regions 11d, 11d . . . , 13d, 13d . . . respectively of the first plane 11a and the second plane 13b for abutment with the resistive elements 5. The firm attachment may also be achieved using solder. In the present embodiment, the plurality of resistive elements 5 are arranged concentrically around the hole portions 1a, 3a respectively formed in the first terminal 1 and the second terminal 3, at regular intervals along the circumferential direction, for example.

At least one of the first terminal 1 and the second terminal 3 (in the figure, the second terminal 3) is provided with a protruding portion 6 protruding on the side thereof opposite to the portion bonded with the resistive elements 5.

The protruding portion 6 has the shape of a ring with a through-hole 6a at the center, for example. The material of the protruding portion 6, as in the case of the electrodes, may be a material with good electrical conductivity, such as Cu. The protruding portion 6 may be molded integrally with the second terminal 3, or may be a separate member connected thereto. The protruding portion 6 may be formed on both the first terminal 1 and the second terminal 3.

An assembly method for the shunt resistor A will be described briefly. The first terminal 1, the second terminal 3, and the resistive elements (for example, cylindrical resistive elements) 5 are prepared. The resistive elements 5 are arranged between the first terminal 1 and the second terminal 3, and then connected by welding. In this way, it is possible to obtain the structure in which the first planes 11a, 13a respectively of the first terminal 1 and the second terminal 3 are opposed to each other, and the first planes 11a-13a are connected by the resistive elements 5.

The resistance value of the shunt resistor A can be adjusted by the number or thickness of the resistive elements 5, or by the distance between the first terminal 1 and the second terminal 3, for example.

The second planes 11b, 13b respectively on the outside of the first terminal 1 and the second terminal 3 may be used for connection with a wiring member, such as a bus bar. Accordingly, a connection area required for a large current can be ensured on the second planes 11b, 13b.

The resistive elements 5 may be pillar-shaped, for example, and bonded with an area smaller than the area of the first planes 11a, 13a. In this way, the resistance value of the shunt resistor does not become too low, and resistance value designing becomes easy. This also contributes to reduction of height of the shunt resistor.

When the plurality of resistive elements are arranged concentrically around the hole portions (through-holes) 1a, 3a respectively formed in the first terminal 1 and the second terminal 3, it becomes possible to obtain a mechanically stable structure of the shunt resistor A as a whole. Additionally, the arrangement contributes to stable sensing accuracy with respect to frequency changes.

The first terminal 1 and the second terminal 3 may have a polygonal shape, such as a triangle as well as a quadrangle, or may be circular. The hole portions 1a, 3a may have a polygonal shape, such as a quadrangle, rather than being circular. This also applies to the other embodiments.

Figure 2A:
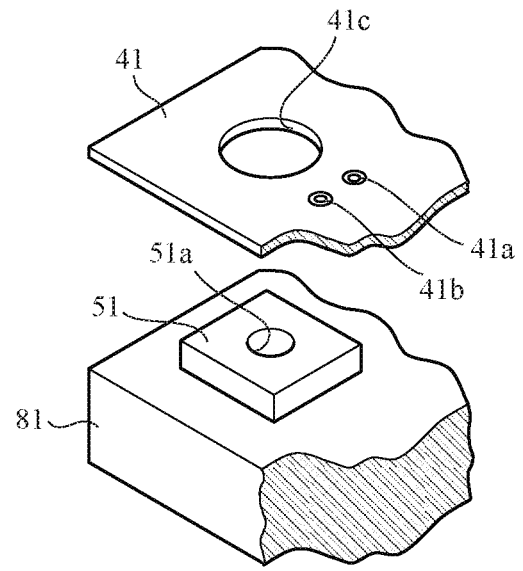
FIGS. 2A and 2B illustrate a process of connecting the shunt resistor depicted in FIGS. 1A-1C to a housing with a mounting substrate therebetween.
Figure 2B:
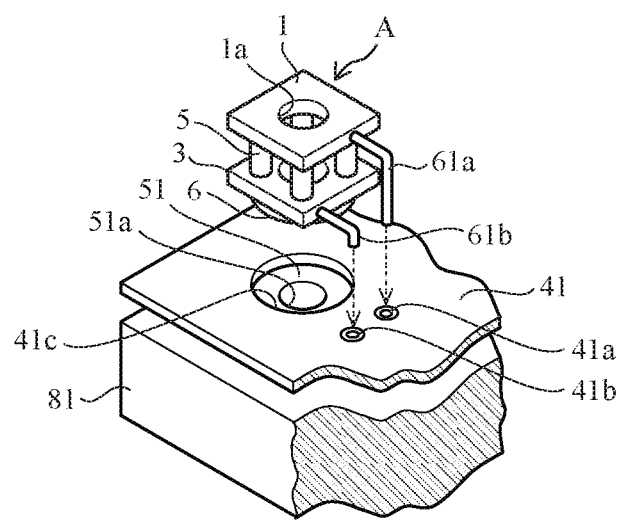

FIGS. 2A and 2B illustrate a process of forming a current sensing device by connecting the shunt resistor A depicted in FIGS. 1A-1C to a housing 81 via a wiring substrate (which may also be referred to as a "mounting substrate") 41. The mounting substrate 41 has wires and various electronic components mounted thereon, including an IC for processing a current signal due to the shunt resistor A. The housing 81 is a casing or the like incorporating a power module with a power semiconductor and the like, for example.

As depicted in FIG. 2A and FIG. 2B, a second wiring member 51 is formed on the housing 81. The mounting substrate 41 is placed on the second wiring member 51. The mounting substrate 41 has a through-hole 41c with an inner diameter substantially equal to an outer diameter of the protruding portion 6. Numeral 41c designates a third through-hole. A through-hole 51a formed in the second wiring member 51 is visible through the through-hole 41c. The mounting substrate 41 is further provided with voltage sensing terminal through-holes 41a, 41b for connection with voltage sensing terminals of the shunt resistor.

As depicted in FIG. 2B, in a state in which the mounting substrate 41 is placed on the housing 81, the shunt resistor A is arranged such that the protruding portion 6 is accommodated within the through-hole 41c. The first terminal 1 and the second terminal 3 respectively have formed first and second voltage sensing terminals 61a, 61b. One end sides of the first and second voltage sensing terminals 61a, 61b respectively are fastened to the side surface 11c of the first terminal and the side surface 13c of the second terminal. The other end sides of the first and second voltage sensing terminals are respectively inserted into the through-holes 41a, 41b formed in the mounting substrate 41 and soldered.

Thus, the protruding portion 6 is accommodated and fit in the through-hole 41c, with the lower surface of the protruding portion 6 abutting on the upper surface of the second wiring member 51. In this way, the shunt resistor A can be provisionally fastened onto the mounting substrate 41.

For example, the thickness of the protruding portion 6 is made equal to the thickness of the mounting substrate 41. In this way, the lower surface of the protruding portion 6 abuts on the upper surface of the second wiring member 51, and the second terminal 3 and the second wiring member 51 are placed in electrical connection with each other. Further, the lower surface (S1 in FIG. 4) of the second terminal 3 abuts on a part (four corner regions) of the upper surface of the mounting substrate 41 so that the shunt resistor A presses down on the mounting substrate 41.

Figure 3C:
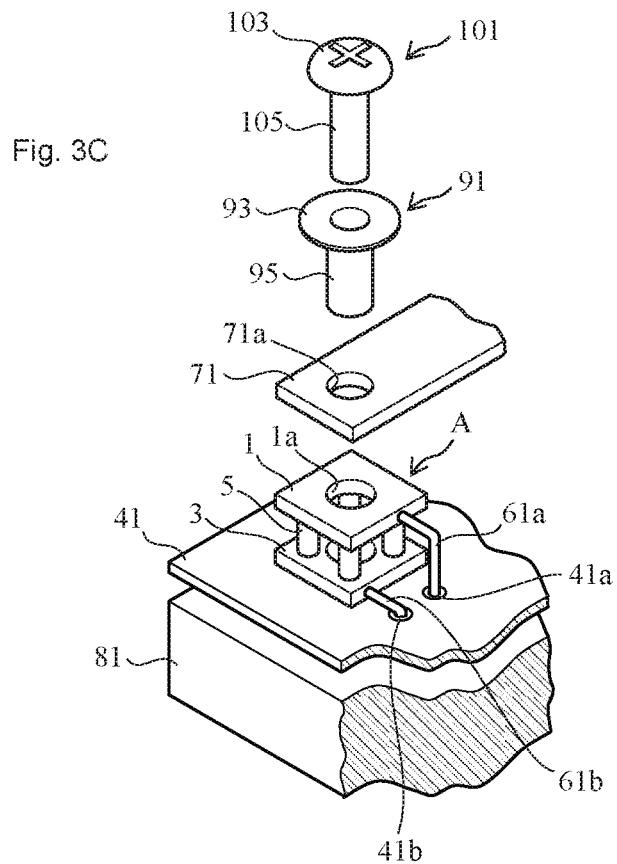
FIGS. 3C and 3D depict views continuing from FIGS. 2A and 2B.
Figure 3D:
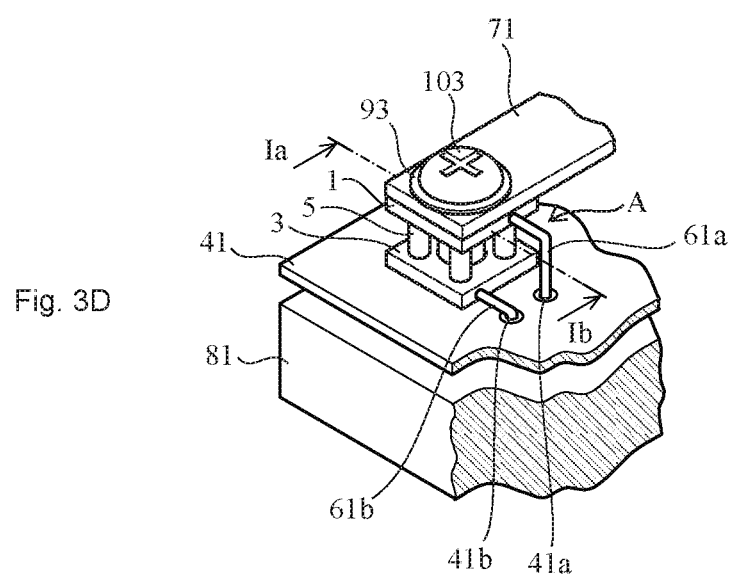
Figure 4:
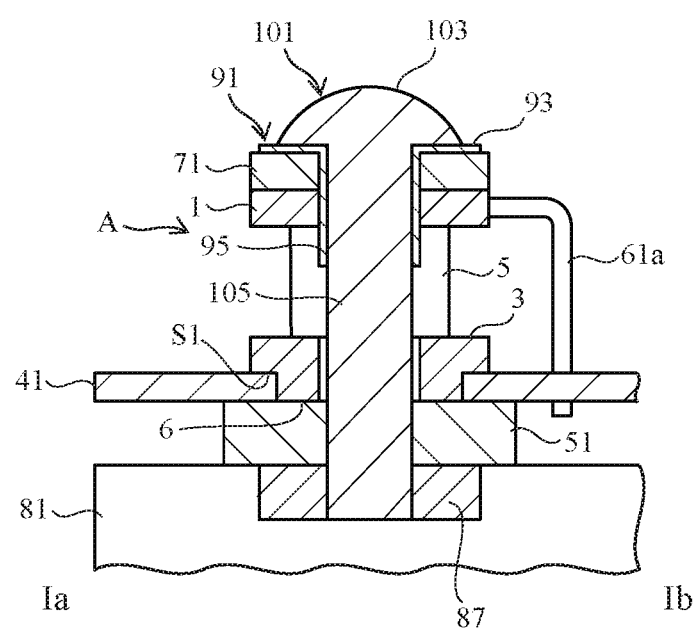
FIG. 4 depicts a cross sectional view taken along line Ia-Ib of FIG. 3(d).

FIG. 3C is an exploded perspective view illustrating how the shunt resistor A and the mounting substrate 41 that have been provisionally fastened are finally fastened to the housing 81. FIG. 3D is a perspective view after threadable fastening. FIG. 4 is a cross sectional view taken along line Ia-Ib of FIG. 3D.

The shunt resistor A and the mounting substrate 41 that have been provisionally fastened and the housing 81 are fastened together with a screw 101 passed through, via an electrically insulating material 91, a through-hole 71a formed in a bus bar 71, the first through-hole 1a and the second through-hole 3a respectively formed in the first terminal 1 and the second terminal 3 of the shunt resistor A, the third through-hole 41c formed in the mounting substrate 41, and the through-hole 51a formed in the second wiring member 51. On the housing 81 side, a nut 87 is arranged to receive the screw 101. The second terminal 3 presses down on a part of the mounting substrate 41, thereby positioning the mounting substrate 41 and the shunt resistor A. This preferably prevents application of an excessive load that, particularly during the handling of the mounting substrate 41 and the like, might cause a disconnection with respect to the parts connecting the voltage sensing terminals 61a, 61b and the voltage sensing terminal through-holes 41a, 41b.

The insulating material 91 includes a flat plate-shaped head portion 93 and a tubular portion 95 continuous therewith. The flat plate-shaped head portion 93 provides insulation between the screw 103 and the surface of the bus bar 71. A shaft portion 105 of the screw 101 is inserted into the tubular portion 95, which provides insulation between the peripheral surface of the shaft portion 105 and the side surfaces of the bus bar 71 and the first terminal 1. In this way, terminal-to-terminal insulation can be maintained. The thickness of the shaft portion 105 of the screw 101 and the inner diameter of the through-hole 3a are set such that the inner surface of the through-hole 3a of the second terminal 3 does not contact the outer periphery of the screw 101.

Thus, the second terminal 3 and the second wiring member 51 are connected through the through-hole 41c formed in the mounting substrate 41.

In the structure, the inner surface of the through-hole 41c and the outer periphery of the protruding portion 6 contact each other at the peripheral surface. Accordingly, horizontal movement of the shunt resistor A is regulated, making the horizontal fastening of the shunt resistor A reliable. In addition, in the fastening structure of FIG. 4, the lower surface of the second terminal 3 abuts on the upper surface of the mounting substrate 41 via a partial region except for the protruding portion 6. This, in combination with the fastening by the screw 101, makes the vertical fastening of the shunt resistor A and the mounting substrate 41 more secure. That is, because the shunt resistor A is fastened by being pressed from above and below, the fastening structure is made more secure.

Thus, in the fastening structure for the current sensing device, it is possible to make the fastening of the shunt resistor A and the mounting substrate 41 to the housing 81 more secure.

Second Embodiment

Figure 5A:
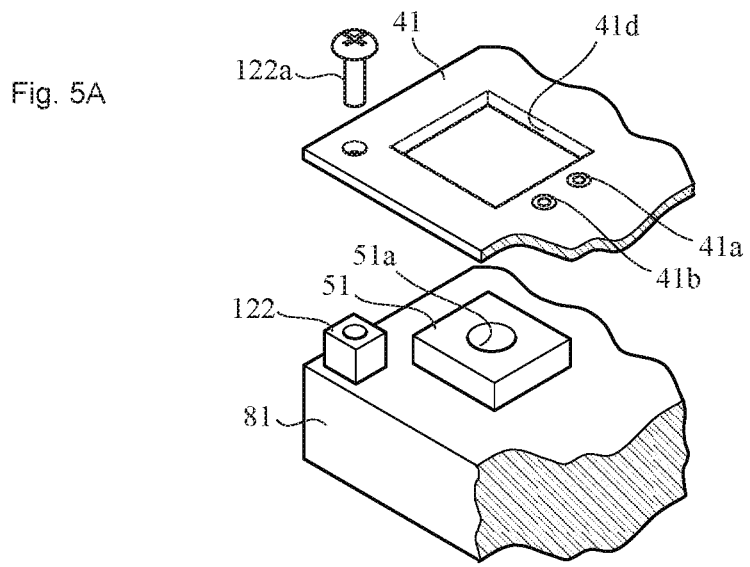
FIGS. 5A-5C illustrate a shunt resistor fastening structure according to a second embodiment of the present invention.
Figure 5B:
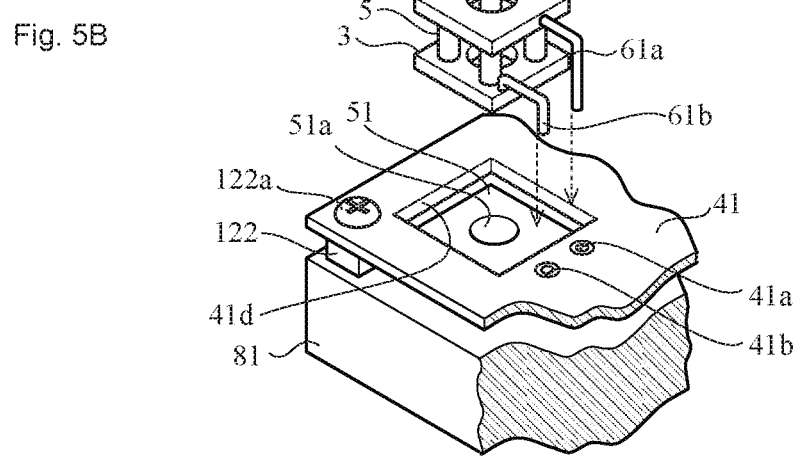
Figure 5C:
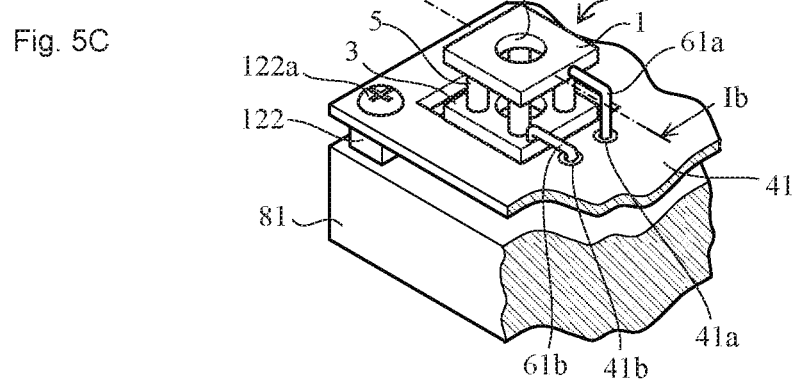

A second embodiment of the present invention will be described. FIGS. 5A-5C illustrate a shunt resistor fastening structure according to the present embodiment. FIG. 5A corresponds to FIG. 2A, FIG. 5B corresponds to FIG. 2B, and FIG. 5C corresponds to FIG. 3C (depiction of the screw 101 is omitted).

The mounting substrate 41 has a through-hole 41d for the second wiring member 51 on the housing. The through-hole 41d of the present implementation example has an opening sufficiently larger than the second terminal 3. As depicted in FIG. 5.4 and FIG. 5B, the mounting substrate 41 is placed such that the second wiring member 51 is visible through the through-hole 41d. The mounting substrate 41 is placed on a spacer 122, and fastened to the housing 81 with a screw 122a. The second wiring member 51 and the mounting substrate 41 are not in contact with each other. Then, as depicted in FIG. 5B and FIG. 5C, the shunt resistor A is mounted so as to be accommodated in the through-hole 41d formed in the mounting substrate 41. The second terminal 3 and the second wiring member 51 are connected. The mounting substrate 41 is spaced apart from the second terminal 3 and the second wiring member 51. The voltage terminals 61a, 61b are inserted into the voltage sensing terminal through-holes 41a, 41b of the mounting substrate 41 and connected.

Figure 6:
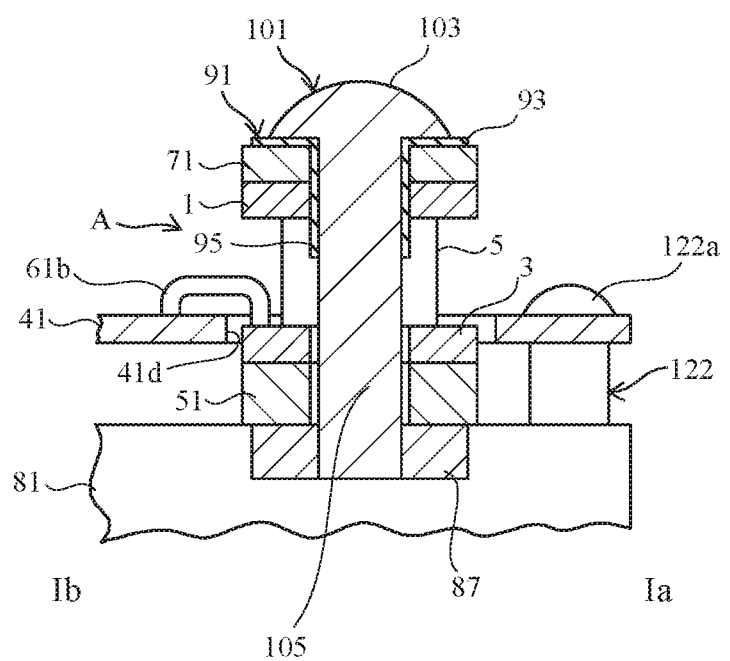
FIG. 6 depicts a cross sectional view taken along line Ia-Ib of FIG. 5C, illustrating a final fastening structure.

FIG. 6 is a cross sectional view taken along line Ia-Ib, in which, in addition to the state of FIG. 5C, the screw 101 is passed through the through-holes formed in the electrodes 1, 3 and fastened and fixed onto the nut 87 on the housing side. The through-hole 41d is formed large enough that the shunt resistor A except for the voltage sensing terminals 61a, 61b does not contact the mounting substrate 41. The shunt resistor A generates heat during use. In the configuration of the present implementation example, it is possible to suppress the transfer of heat generated by the shunt resistor A to the mounting substrate 41.

Third Embodiment

Figure 7A:
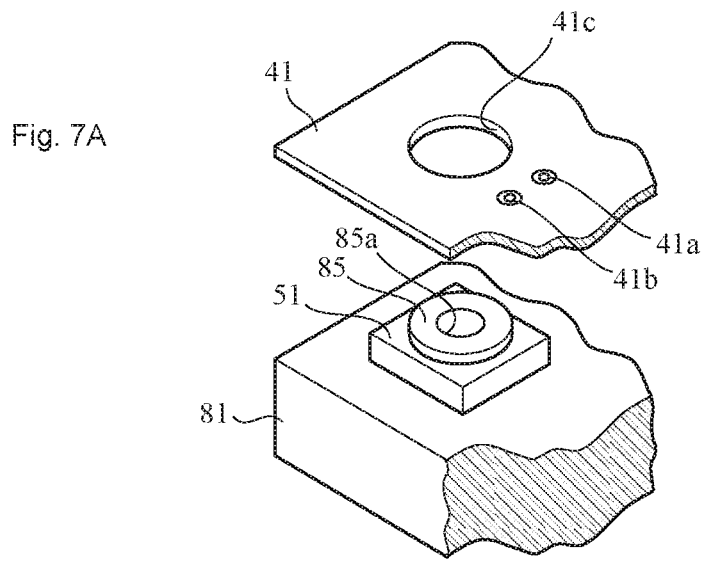
FIGS. 7A-7C illustrate a shunt resistor fastening structure according to a third embodiment of the present invention.
Figure 7B:
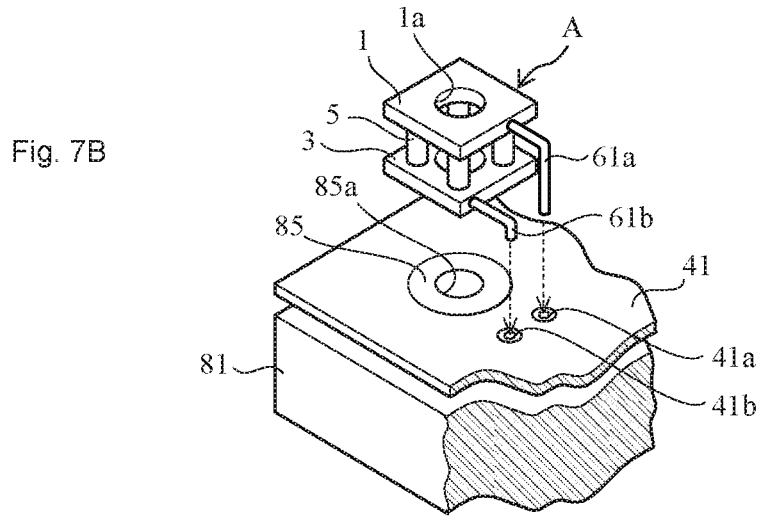
Figure 7C:
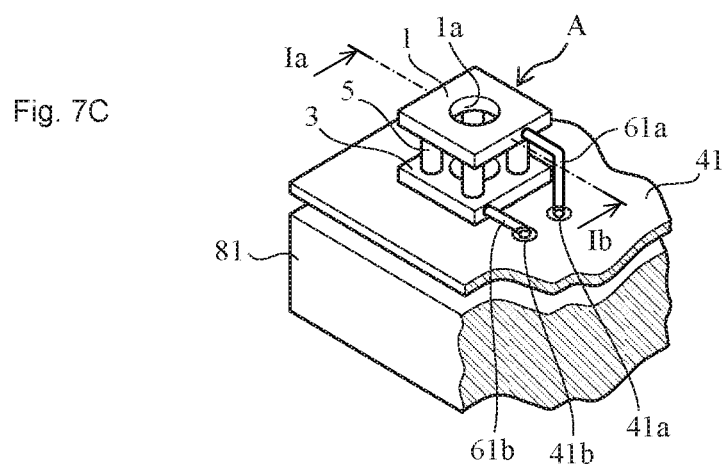

A third embodiment of the present invention will be described. FIGS. 7A-7C illustrates a fastening structure for the shunt resistor A according to the present embodiment. FIG. 7A corresponds to FIG. 2A of the first embodiment. FIG. 7B corresponds to FIG. 2B of the second embodiment. FIG. 7C corresponds to FIG. 3C of the second embodiment.

In the present embodiment, a ring-shaped fastening member 85 is disposed on the upper surface of the second wiring member 51 disposed on the housing 81. The second wiring member 51 including the ring-shaped fastening member 85 has a through-hole 85a. The through-hole 41c of the mounting substrate 41 has a size and shape to fit the ring-shaped fastening member 85.

When the mounting substrate 41 is placed on the housing 81, the through-hole 41c of the mounting substrate 41 fits with the ring-shaped fastening member 85. Preferably, in this state, the mounting substrate 41 and the fastening member 85 become flush with each other.

Figure 8:
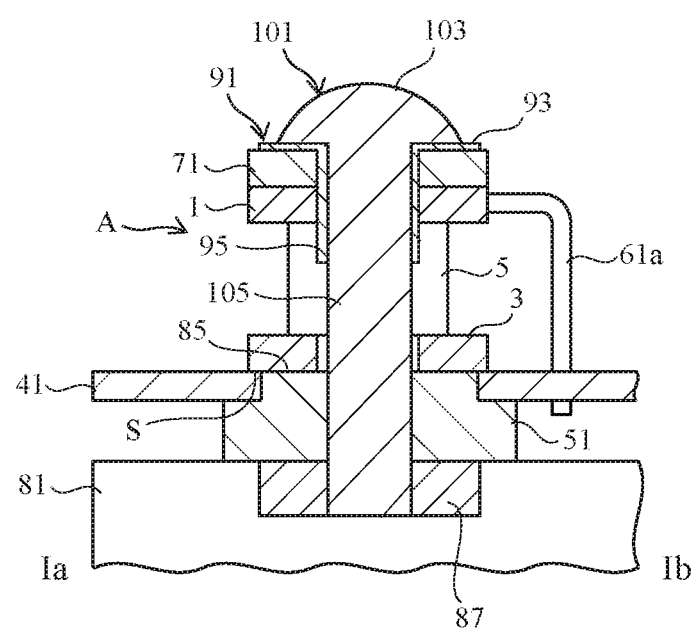
FIG. 8 depicts a cross sectional view taken along line Ia-Ib of FIG. 7C, illustrating a final fastening structure.

Then, the shunt resistor A is placed on the mounting substrate 41. In this state, as depicted in FIG. 8, the shunt resistor A and the mounting substrate 41 can be fastened to the housing 81 by the screw 101, for example. The insulating structure using the insulating material 91 is similar to that of the first embodiment described with reference to FIGS. 3C and 3D and FIG. 4.

A peripheral portion of the lower surface of the second terminal 3 abuts on the periphery of the through-hole 41c of the mounting substrate 41 (abutment surface is indicated by sign S), thus pressing on the mounting substrate 41.

According to the present embodiment, in a state in which the mounting substrate 41 and the fastening member 85 are fastened to each other, it is possible to place the shunt resistor A thereon stably.

Fourth Embodiment

Figure 9A:
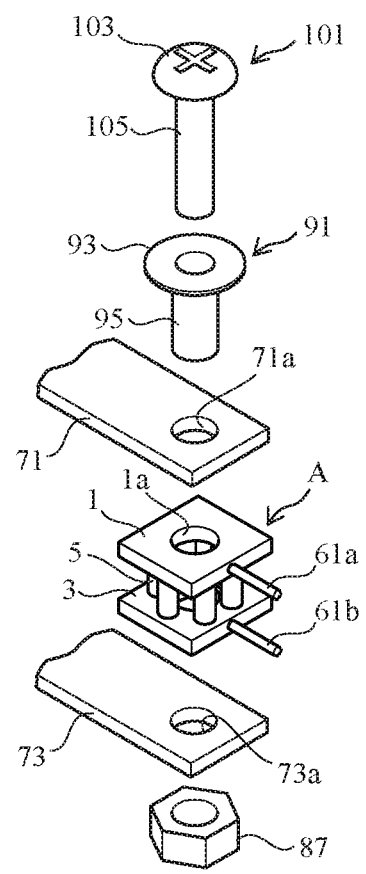
FIGS. 9A and 9B illustrate a shunt resistor fastening structure according to a fourth embodiment of the present invention, FIG. 9A depicting an exploded perspective view and FIG. 9B depicting a perspective view after threadable fastening.
Figure 9B:
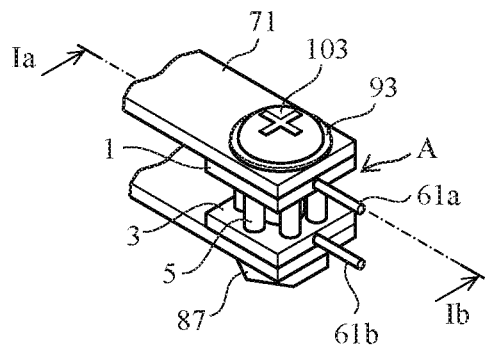
Figure 10:
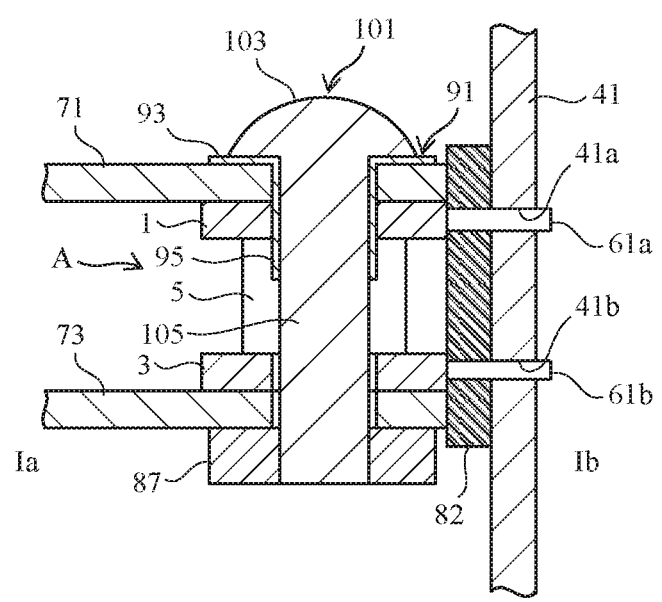
FIG. 10 depicts a cross sectional view taken along line Ia-Ib of FIG. 9B, illustrating a final fastening structure.

A fourth embodiment of the present invention will be described. FIGS. 9A and 9B illustrate a shunt resistor fastening structure according to the present embodiment. FIG. 9A is an exploded perspective view. FIG. 9B is a perspective view after threadable fastening. FIG. 10 illustrates a structure in which fastening has been performed using a screw, and differs from FIG. 4 in the following points:

1) The nut member 87 is disposed on the lower side of a bus bar 73, and is threadably fastened with the screw member 101 through the first and second bus bars 71, 73 sandwiching the shunt resistor.

2) The voltage sensing terminals 61a, 61b respectively extending from the first terminal 1 and the second terminal 3 are inserted into and fastened in the voltage sensing terminal through-holes 41a, 41b in the mounting substrate 41, with a rubber-like terminal reinforcing member (cushioning material) 82 therebetween.

In the present embodiment, the shunt resistor A and the mounting substrate 41 are fastened to each other by the voltage sensing terminals 61a, 61b.

When the rubber-like terminal reinforcing member 82 is interposed between the shunt resistor A and the mounting substrate 41, it is possible to reinforce the voltage sensing terminals 61a, 61b.

Fifth Embodiment

Figure 11A:
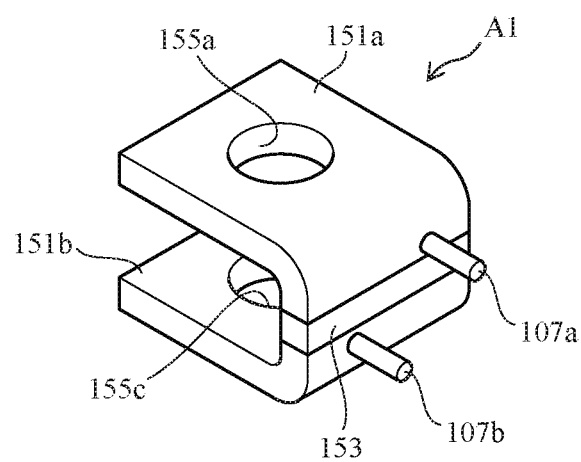
FIGS. 11A-11C depict perspective views illustrating other structure examples of shunt resistors according to a fifth embodiment.
Figure 11B:
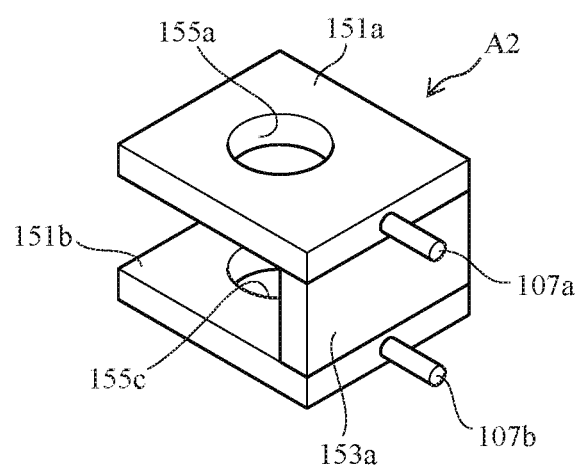
Figure 11C:
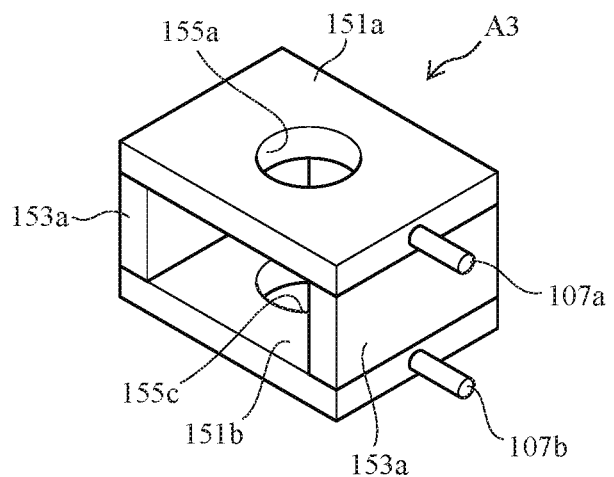

A fifth embodiment of the present invention will be described. FIG. 11A to FIG. 11C depict perspective views illustrating other examples of the shunt resistor according to the present embodiment. FIG. 11A depicts a shunt resistor A1 that includes a resistive element 153 and first and second electrode portions (terminals) 151a, 151b, wherein the electrodes are bent in C shape in cross section. FIG. 11B depicts a shunt resistor A2 that includes a resistive element 153a, wherein an upper surface or a back surface at the ends of the electrodes 151a, 151b is connected to end surfaces of the resistive element 153a in surface contact. FIG. 11C depicts a shunt resistor A3 that includes another resistive element 153a disposed at the ends of the electrodes 151a, 151b on the opposite side to the resistive element 153a of the shunt resistor A2 depicted in FIG. 11B. That is, the shunt resistor A3 is provided with two resistive elements 153a.

The first and second electrode portions 151a, 151b of the shunt resistors A1 to A3 respectively have through-holes 155a, 155c at vertically corresponding positions. Voltage sensing terminals 157a, 157b respectively protrude from the first and second electrode portions 151a, 151b in the vicinity of the resistive elements 153, 153a in a direction perpendicular to the surfaces of the resistive elements 153, 153a.

Figure 12A:
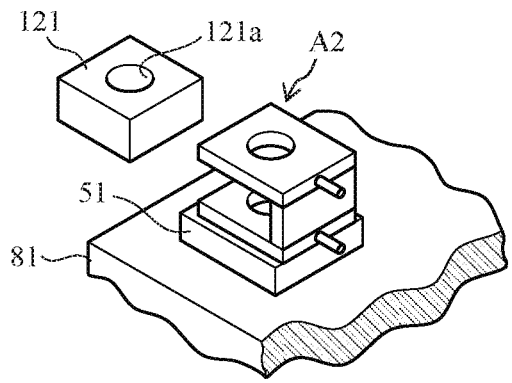
FIGS. 12A-12C illustrate how any of the shunt resistors illustrated in FIGS. 11A-11C is attached to a housing.
Figure 12B:
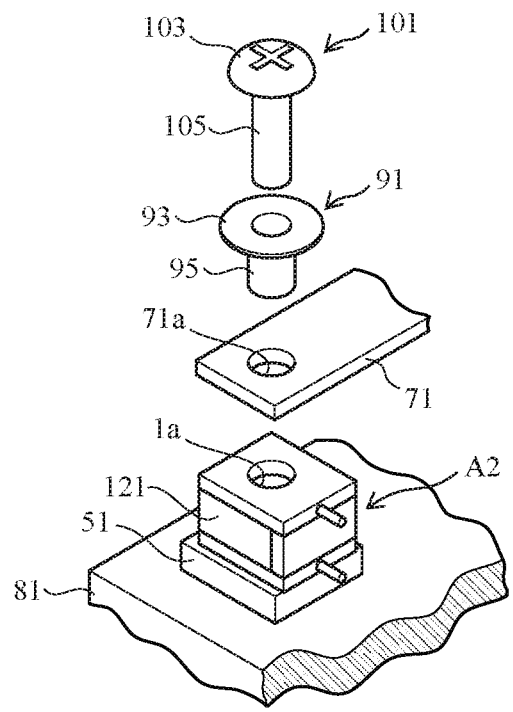
Figure 12C:
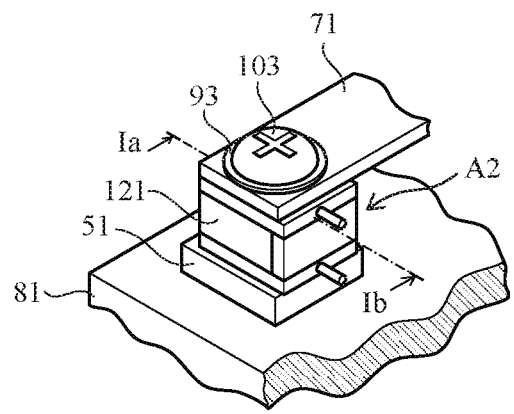

FIGS. 12A-12C illustrate how the shunt resistor A2 is attached to the housing 81. As illustrated in FIG. 12A, a spacer member 121 having a through-hole 121a is interposed between the electrode portions 151a, 151b, and the shunt resistor A2 is placed on the wiring member 51 on the housing 81. Particularly, in the shunt structures of A1 and A2, one side of the electrodes is open, resulting in the problem of being deformed easily when pressed during threadable fastening, for example. The spacer member 121 is a member (an electrically insulating material such as ceramics or rubber) for preventing deformation during threadable fastening.

Then, as depicted in FIGS. 12B and 12C, the shunt resistor A2 and the bus bar 71 placed thereon are fastened by the screw 101 and the insulating material 91. The insulating structure using the insulating material 91 is similar to that of the first embodiment described with reference to FIGS. 3C and 3D and FIG. 4.

Figure 13:
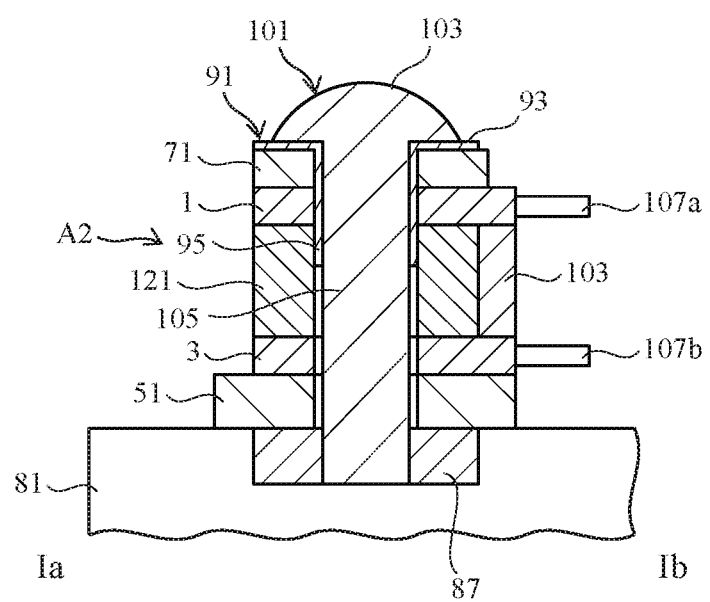
FIG. 13 depicts a cross sectional view taken along line Ia-Ib of 12C, illustrating a final fastening structure.

Accordingly, as depicted in FIG. 13, it is possible to fasten the shunt resistor A2 onto the housing 81 by the screw 101 through the spacer member 121.

The present embodiment provides the advantage of not being deformed easily during threadable fastening.

The spacer member 121 provides the advantage that, apart from the threadable fastening structure, the shunt structures A1, A2 can be reinforced.

Sixth Embodiment

A sixth embodiment of the present invention will be described.

FIGS. 14A-14E illustrate an example of an assembly method for the shunt resistor A described in the first embodiment As depicted in FIG. 14A, for example, the second terminal 3 provided with the protruding portion 6 is prepared. As depicted in FIG. 14B, four T-shaped holders 201a to 201d are placed over one another and installed on the second terminal 3. When the four resistive elements 5 are formed, the four T-shaped holders 201a to 201d, which are for positioning the resistive elements 5, are placed over one another and installed with the top of the Ts lying along the four sides of the second terminal 3. The top of the T has semi-circular cutouts 202 on both sides thereof.

As the four cutouts 202 are aligned in an overlapping manner, it becomes possible to form the inner surfaces (planned positions for installing the resistive elements) of four hole portions 203 for provisional fastening for holding the four resistive elements 5 at predetermined positions.

Then, as depicted in FIG. 14B, the four resistive elements 5 are installed at the provisional-fastening four hole portions 203, and the second terminal 3 and the four resistive elements 5 are firmly attached to each other by a fastening method using, for example, solder or an adhesive (such as a nanopaste using nanoparticles of Cu or Ag, for example). As depicted in FIG. 14D, the first terminal 1 and the four resistive elements 5 are firmly attached to each other by a fastening method using solder or an adhesive. As depicted in FIG. 14E, the four holders 201a to 201d are removed, whereby the shunt resistor A is formed.

According to the present embodiment, the position of the resistive element can be determined easily using the detachable positioning jig.

Seventh Embodiment

A seventh embodiment of the present invention will be described.

Figure 15A:
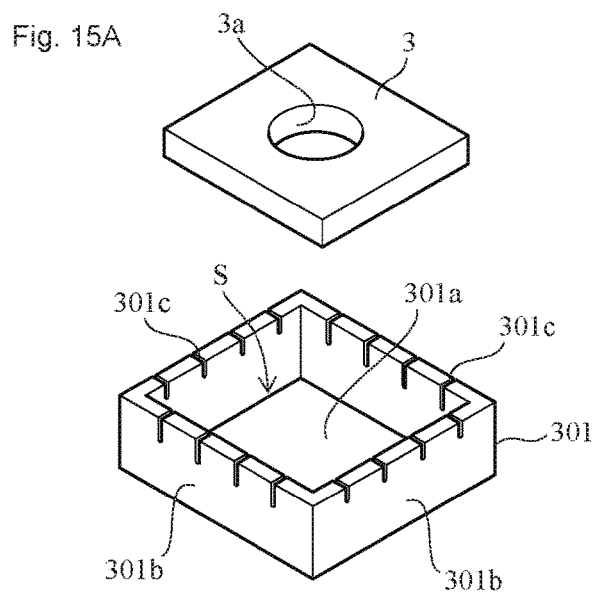
FIGS. 15A-15F illustrate a modification, according to a seventh embodiment of the present invention, of the method of assembling the shunt resistor described in the first and the sixth embodiments.

FIGS. 15A-15F illustrate a modification of the method of assembling the shunt resistor A described in the first and sixth embodiments. As depicted in FIG. 15A, a positioning jig 301 is prepared. The positioning jig 301 includes, for example, a square bottom plate portion 301a and side wall portions 301b rising from the four sides. Thus, an accommodating space S for accommodating the second terminal 3 is formed. Further, a plurality of groove portions (slits) 301c are formed in the upper part of the side wall portions 301b. In FIG. 15A, four groove portions 301c are formed in each of the side wall portions 301b.

Figure 15B:
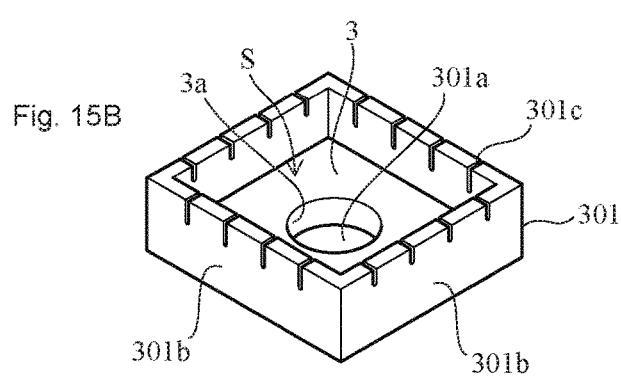
Figure 15C:
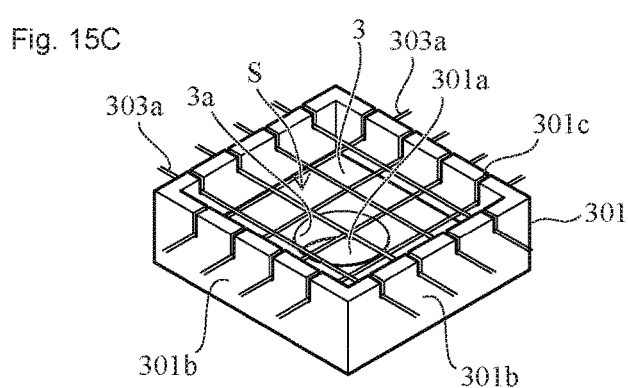

As depicted in FIG. 15B, the second terminal 3 is accommodated in the accommodating space S of the positioning jig 301 for the second terminal 3, in such a way that the upper surface of the bottom plate portion 301a and the lower surface of the second terminal 3 abut on each other. As depicted in FIG. 15C, an elastic wire 303a is passed through two groove portions 301c opposing each other. In FIG. 15C, a total of eight wires 303a are passed, four in one direction and another four in a direction perpendicular thereto. Accordingly, at least 3×3 substantially square enclosures (nine squares) are formed by the wires 303a.

Figure 15D:
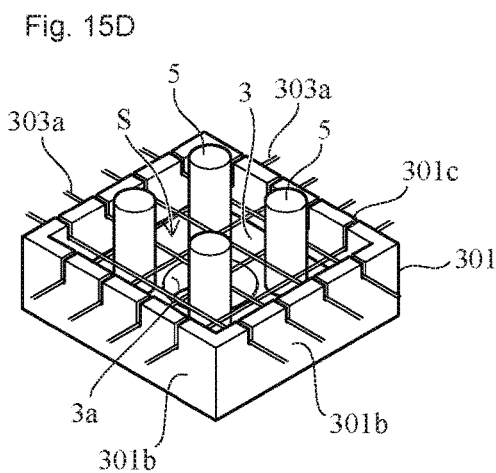

The cylindrical resistive elements 5, for example, can be disposed vertically at desired positions out of the nine square enclosures. As depicted in FIG. 15D, when a single-square space is provided between adjacent resistive elements 5, a short between the resistive elements 5 can be prevented, for example. In the illustrated example, four resistive elements 5 are disposed vertically.

Figure 15E:
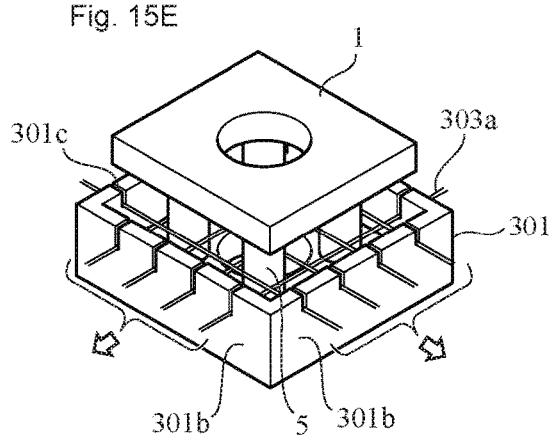

As depicted in FIG. 15E, the first terminal 1 is disposed over the four resistive elements 5 and adhered.

Figure 15F:
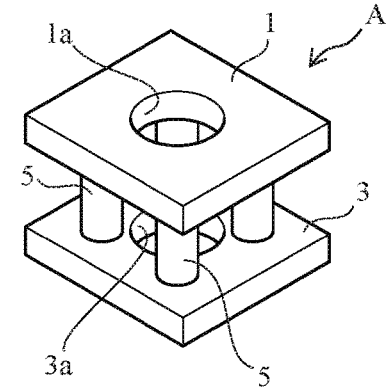

As depicted in FIG. 15F, the wires 303a are removed and the positioning jig 301 is detached, whereby a shunt resistor similar to the one depicted in FIGS. 1A-1C can be formed.

According to the present embodiment, it is possible, with the groove portions (slits) 301c and the wires 303a of the positioning jig 301, to dispose the resistive elements 5 at desired positions between the first terminal 1 and the second terminal 3, and to increase the freedom as to the arranged shape and number of the resistive elements. In addition, the simple passing of wires helps to reduce the cost required for assembly. There is also the advantage that the wires can be removed easily after the resistive elements have been fastened.

Eighth Embodiment

An eighth embodiment of the present invention will be described.

Figure 16A:
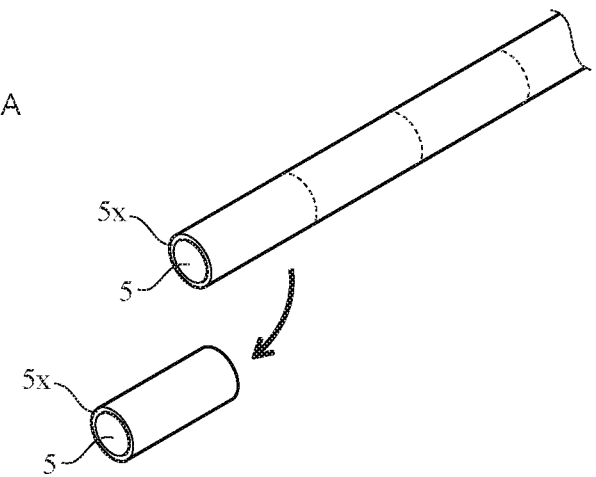
FIGS. 16A and 16B illustrate an example, according to an eighth embodiment of the present invention, of a manufacturing process for the shunt resistor described in the first and the sixth embodiments.
Figure 16B:
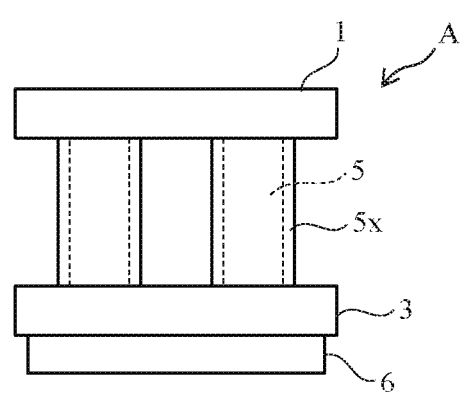

FIGS. 16A and 16B illustrate an example of a part of the process of manufacturing the shunt resistor A described in the first and sixth embodiments.

As depicted in FIG. 16A, a resin, such as an epoxy resin 5x, is applied to an outer peripheral surface of an elongate resistor material and cured.

Then, the resistor material is cut to a desired length for singulation of the resistive elements 5.

Referring to FIG. 16B depicting a side view, the resistive elements 5 are arranged between the first terminal 1 and the second terminal 3. The second terminal 3 may be provided with the protruding portion 6 described in the first embodiment.

According to the present embodiment, an insulating coating is formed on the outer peripheral surface of the resistive elements 5. Accordingly, in the seventh embodiment, for example, even when the resistive elements 5 are arranged at adjacent positions, it is possible to prevent a short circuit between the resistive elements 5. Thus, the freedom of arrangement of the resistive elements 5 is increased.

It also becomes possible to suppress resistance value variations due to solder wicking when the resistive elements 5 have been adhered to the first terminal 1 and the second terminal 3 by soldering.

Ninth Embodiment

A ninth embodiment of the present invention will be described.

Figure 17A:
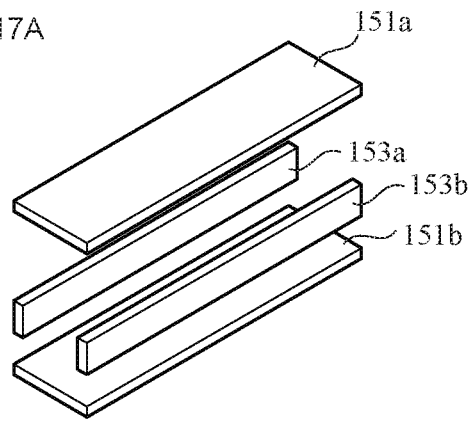
FIGS. 17A-17E illustrate an example, according to a ninth embodiment of the present invention, of the process of mass-producing the shunt resistor as illustrated in FIG. 11A.
Figure 17D:
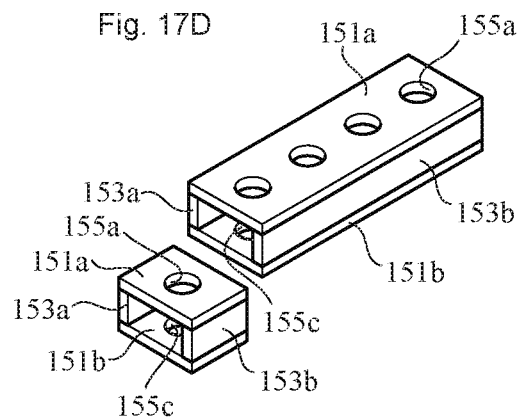
Figure 17B:
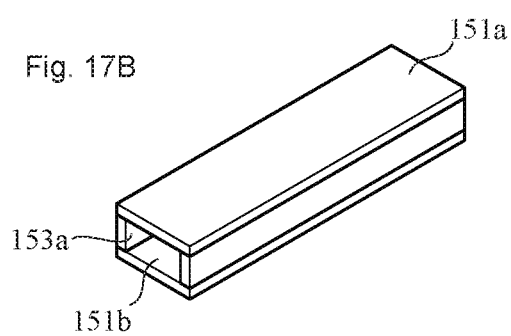

FIGS. 17A-17E illustrate an example of the process of mass-producing the shunt resistor depicted in FIG. 11C. As depicted in FIG. 17A, a first terminal material 151a and a second terminal material 151b are opposed to each other. A first resistor material 153a and a second resistor material 153b are opposed to each other and arranged between the terminal materials, whereby a substantially cuboidal structure is made, as depicted in FIG. 17B.

Figure 17E:
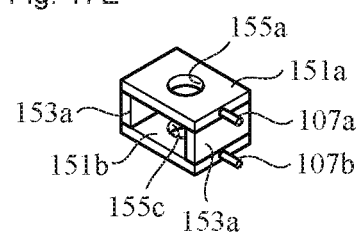
Figure 17C:
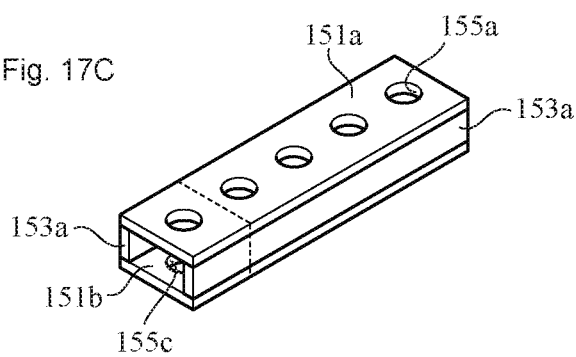

As depicted in FIG. 17C, a plurality of through-holes 155a, 155c are formed at opposing positions of the first terminal material 151a and the second terminal material 151b.

As depicted in FIG. 17D, cutting is performed at a predetermined position for singulation. Then, as depicted in FIG. 17E, the voltage sensing terminals 107a, 107b are respectively disposed on end surfaces of the first terminal 151a and the second terminal 151b by welding, for example.

Through the above steps, it is possible to mass-produce the shunt resistor of FIG. 11C.

With respect to the foregoing embodiments, the configurations and the like depicted in the attached drawings are not to be taken as limiting and may be otherwise modified, as appropriate, as long as the effects of the present invention can be obtained. The embodiments may also be modified, as appropriate, and implemented without departing from the scope of the objective of the present invention.

Constituent elements of the present invention may be omitted or selected as needed, and an invention provided with a configuration obtained as a result of such omission or selection is also included in the present invention.

INDUSTRIAL APPLICABILITY

The present invention may be utilized in a shunt resistor.

All publications, patents, and patent applications cited in the present description are incorporated herein by reference in their entirety.

What is claimed is:

1. A shunt resistor comprising:
first and second planar terminals arranged in parallel to each other and each made of an electrically conductive metal material, each of the first and second planar terminals has a through-hole formed through the planar terminal;
a plurality of columnar resistive elements each extensive in its length direction between the parallelly arranged first and second planar terminals and each connected directly to the parallelly arranged first and second planar terminals, wherein the plurality of columnar resistive elements are arranged in such a manner as surrounding the through-holes formed in the parallelly arranged first and second planar terminals; and
a protruding portion provided to at least one of the parallelly arranged first and second planar terminals, the protruding portion protruding from a surface of the terminal opposite to the surface thereof facing the other terminal.

2. A current sensing device comprising:
first and second wiring members constituting a current pathway;
a housing having the second wiring member;
a wiring substrate; and
a shunt resistor short-circuiting the first wiring member and the second wiring member, the shunt resistor having first and second terminals made of an electrically conductive metal material and a resistive element disposed between the first and second terminals, the first and second terminals respectively having a first through-hole and a second through-hole formed therein,
wherein:
the first terminal is connected to the first wiring member;
the second terminal and the second wiring member are connected through a third through-hole formed in the wiring substrate; and
the shunt resistor and the second wiring member are fastened to each other by a fastening member passed through the first through-hole and the second through-hole.

3. The current sensing device according to claim 2, wherein the second terminal has a protruding portion formed thereon, the protruding portion being accommodated in the third through-hole.

4. The current sensing device according to claim 3, wherein the second terminal presses on the wiring substrate around the third through-hole.

* * * * *